United States Patent [19]

Pa et al.

[11] Patent Number: 4,722,763

[45] Date of Patent: Feb. 2, 1988

[54] METHOD FOR MAKING IRREGULAR SHAPED SINGLE CRYSTAL PARTICLES FOR USE IN ANODES FOR ELECTROCHEMICAL CELLS

[75] Inventors: David Pa, Atlanta; Ronald A. Putt, Norcross; Douglas Black, Smyrna, all of Ga.

[73] Assignee: Duracell Inc., Bethel, Conn.

[21] Appl. No.: 945,596

[22] Filed: Dec. 23, 1986

[51] Int. Cl.$^4$ .............................................. C30B 29/60
[52] U.S. Cl. .................... 156/616.1; 156/617 M; 156/617 R; 156/620; 156/DIG. 61; 156/DIG. 71; 156/DIG. 73; 156/DIG. 76; 156/DIG. 77; 156/DIG. 78; 156/DIG. 83; 156/DIG. 89; 156/DIG. 92; 156/DIG. 105; 156/DIG. 110; 204/292; 204/293; 429/229
[58] Field of Search .......... 156/616 R, 617 M, 617 R, 156/620, DIG. 61, DIG. 71, DIG. 73, DIG. 76, DIG. 77, DIG. 78, DIG. 83, DIG. 89, DIG. 92, DIG. 100, DIG. 105, DIG. 110; 204/292, 293, 294, 242; 429/229

[56] References Cited

U.S. PATENT DOCUMENTS

| | | | |
|---|---|---|---|
| 3,853,596 | 12/1974 | Distler et al. | 156/602 |
| 4,033,792 | 7/1977 | Giamei et al. | 156/600 |
| 4,487,651 | 12/1984 | Wang | 156/DIG. 83 |
| 4,585,716 | 4/1986 | Chalilpoyil et al. | 156/616 R |
| 4,632,890 | 12/1986 | Wang | 204/292 |
| 4,637,855 | 1/1987 | Witter et al. | 156/616 R |

FOREIGN PATENT DOCUMENTS 2141357 12/1984 United Kingdom ............ 156/616 R

*Primary Examiner*—Asok Pal
*Attorney, Agent, or Firm*—Ronald S. Cornell; James B. McVeigh

[57] ABSTRACT

A method of making single crystals of metal or other crystallizing materials whereby powders of irregular shaped single crystal particles (as small as 325 mesh or about 50 microns) may be readily and economically made. Said method comprises the steps of: (a) forming thin individual coatings on each of said particles such as oxides of metals on metal particles; (b) adding a combustible material to the coated particles and subjecting the combustible material to combustion; (c) melting the particle material within said coatings which function as individual particle crucibles; (d) cooling the melted particles within the coatings to form individual single crystals each within its own coating; and (e) removing the coating such as by solvation with a solvent or by chemical reaction. The single crystal particles conform to the original shape of the particles which may be irregular. Such irregular shaped single crystals, such as of zinc, when used in electrochemical cell anodes enables the utilization of reduced amounts of mercury for amalgamation thereof without significant increase in cell gassing.

12 Claims, No Drawings

METHOD FOR MAKING IRREGULAR SHAPED SINGLE CRYSTAL PARTICLES FOR USE IN ANODES FOR ELECTROCHEMICAL CELLS

The invention relates to methods of reducing mercury content in electrochemical cell anode amalgamations and to methods of making single crystal particles, particularly small metal particles. More specifically this invention relates to single crystal zinc particles for use in anodes of electrochemical cells.

Metals such as zinc have been commonly utilized as anodes in electrochemical cells particularly in cells with aqueous alkaline electrolytes. In such cells the zinc is amalgamated with mercury in order to prevent reaction of zinc with the aqueous electrolyte with the detrimental evolution of hydrogen gas. In the past it has been necessary to utilize about 6-7% by weight of mercury amalgamation in the anode to reduce the amount of "gassing" to acceptable levels. However, because of environmental considerations it has become desirable to eliminate or at the very least reduce the amount of mercury utilized in such cells but without concomitant increase in cell gassing. Various expedients have been utilized, to achieve such mercury reduction, such as special treatment of the zinc, the use of additives and special treatment of the zinc, the use of additives and exotic amalgamation methods. However, such methods have either had economic drawbacks or limited success.

It is an object of the present invention to provide a means for permitting the reduction of the amount of mercury used in amalgamation of aqueous electrochemical cell anode metals without significant concomitant increase in cell gassing or reduction of cell performance.

It is a further object of the present invention to provide a novel method of making single crystal particles and within the single crystal particles of metals such as zinc and of irregular shape allows for reduction of mercury.

It is still a further object of the present invention to provide an electrochemical cell having such single crystal metal particles in the anode thereof.

These and other objects, features and advantages of the present invention will become more evident from the following discussion.

Generally the present invention relates to a novel economical method for reducing the amounts of mercury required for analgamating anode metals without concomitant detrimental effects. Such method comprises the utilization of irregular shaped single crystal particles in the formation of the cell anode. However, such irregular shaped metal particles, such as of zinc, cannot be formed by conventional single crystal forming methods. The formation of single crystals for the most part has been confined to semiconductors and laboratory curiosity and such single crystals have been formed in a variety of ways which have provided relatively large single crystals with generally ordered shapes. Metallic single crystals have generally only been made in the form of very fine "whiskers" which have been difficult and expensive to produce and are utilized, because of their high tensile strength, for structural reinforcement. The method described in U.S. Pat. Nos. 3,844,838 and 3,853,625 while forming partial single crystal zinc filaments, also forms polycrystalline side growths.

U.S. Pat. No. 4,487,651 discloses a novel method for making individual single crystal particles, wherein such particles may be of sizes as small as 325 mesh and of a regular or irregular shape as required. The invention disclosed in U.S. Pat. No. 4,487,651 further encompasses such irregular shaped single crystal particles, the electrochemical cell anodes comprised of such single crystal particles and the electrochemical cells containing such anodes. U.S. Pat. No. 4,487,651 discloses that a substantial amount of the mercury utilized for amalgamation with metal anode materials, most notably zinc, for reduction of gassing, was entrapped within defects such as grain boundaries, subgrain boundaries and dislocation of the polycrystalline metal particles. Furthermore, such defect areas were also areas of high chemical activity which accelerated detrimental gas formation. However, the use of single crystals made by prior conventional methods generally comprising controlled melting and freezing, or as in the prior art patents by electrolysis while effective in removing such defects, destroyed the utility of the zinc as a anode material or did not provide only single crystals. With the formation of pure single crystals the irregular shape of the metal powder particles required for electrochemical activity i.e. high surface area was eliminated. As a result regular shaped spherical particles in a particular range of $-20$ to 325 mesh provided about 30% of void space. Similarly sized irregular shaped particles provided between 50-80% void space. Additionally, in the conventional formation of single crystals the particles themselves are detrimentally fused into lumps or have polycrystalline outgrowths. Electrochemical activity would therefore either be destroyed or substantially curtailed with the use of conventional pure single crystals. Accordingly, such single crystal metals were not effectively utilizable in electrochemical cells.

The present invention comprises an improvement of the method disclosed in U.S. Pat. No. 4,487,651 for the formation of small pure single crystal particles particularly of metals such as of zinc wherein the defect areas are eliminated, and the irregular shape of the zinc particles maintained without detrimental lumping of the particles or polycrystalline growths. In particular, the invention comprises the addition of a material which is combustible at the processing temperatures employed prior to the melting stage.

The method of forming single crystals of the present invention generally comprises initially forming a thin continuous coating (e.g. an oxide layer on metal) on each of the particles. A combustible material is added to the particles containing the thin coating. Thereafter the particle material is melted within the coating which functions as a "crucible" for containing the molten particle material. The combusting of the combustible material improves the prevention of interparticulate fusing or formation of lumps. The molten particle material is then solidified by slow or controlled freezing into single crystal particles having the shape of the coating "crucible" or the original shape of the particle to which such coating was initially conformed. The thin coating layer is then removed and pure single crystal particles are obtained. For use as an anode material, the single crystal particles are irregularly shaped and are mercury amalgamated either after or during such coating removal. The use of the single crystal particle permits reduction of amounts of mercury without significant detrimental effect. For example, in conjunction with zinc single crystal particles, the amount of mercury utilized for amalgamation may be reduced from 7% to about 4% without significant increase in gassing of detrimental reduction of cell capability.

In order for the method of the present invention to be efficacious it is necessary that the coating composition melts or decomposes at a substantially higher temperature when compared to the particle material whereby it can function as a "crucible" for the molten particle material. Additionally, such coating must be substantially continuous and of sufficient mechanical strength and chemical stability to completely contain the particle material during the melting and freezing stages. The coating should be of sufficiently thin dimension such that it may be readily removed, when required, without disruption of the single crystal particles. Most important, the combustible material must be added to the container containing the particles prior to the melting step.

In preferred embodiments, particularly for utilization in electrodes such as anodes of electrochemical cells, the particle materials are metals and the coatings are oxides of the metals respectively. The metals are oxidized, preferably under controlled heating conditions, in the presence of oxidants such as air, $H_2O$, $CO_2$ and the like whereby a thin continuous film of the metal oxide coats each particle. Particles utilized in electrochemical cells are of deliberate irregular configuration for increased surface area and enhanced electrochemical activity. Additionally, the particles in such applications generally range in size from 325 mesh to −20 mesh (abut 50–500 microns) with an average preferred particle size of between −100 to 200 mesh. The formation of the oxide coatings is therefore controlled to be substantially uniformly conformed to the irregular particle configuration even with the small particle sizes and thereafter should maintain such configuration.

After the formation of the oxide coating the combustible material is admixed with the particles and the particles are melted within the oxide coatings which function as individual cruibles and the molten metal. Such melting takes place in the absence of oxidants to prevent further growth of the oxide layer. The combustible material in subsequent heating of the particles burus and consume all of the free oxygen in the intersticial spaces. The oxide coated particles may be melted in a closed container or in a inert atmosphere to avoid such increased oxide growth. As mentioned, in order for the oxide coating to function as a crucible, the oxide of the metal must have a substantially higher melting or decomposition temperature than that of the metal. Examples of metals and their oxides which permit such "crucible" operation and which are utilizable as electrode materials in electrochemical cells (e.e. which provide sufficiently utilizable potentials) include:

TABLE 1

| Metal | Melting temp. °C. | Oxide | Melting or decom. temp °C. |
| --- | --- | --- | --- |
| Aluminum | 660 | $Al_2O_3$ | — |
| Cadmium | 320 | CdO | 1500 |
| Calcium | 842 | CaO | 2614 |
| Copper | 1083 | CuO | 1326 |
| Lead | 327 | PbO | 886 |
| Lithium | 180 | $Li_2O$ | 1700 |
| Magnesium | 649 | MgO | 2852 |
| Nickel | 1453 | $NiO_2$ | — |
| Potassium | 64 | $K_2O$ | 350 |
| Rubidium | 39 | RbwO | 400 |
| Sodium | 98 | $Na_2O$ | 1275 |
| Tin | 232 | SnO | 1080 |

TABLE 1-continued

| Metal | Melting temp. °C. | Oxide | Melting or decom. temp °C. |
| --- | --- | --- | --- |
| Zinc | 419 | ZnO | 1975 |

It is noted that common anode metals such as silver and iron cannot be utilized in providing the single crystal particles of the present invention by utilizing their oxides as the crucible coatings because the melting or decomposition temperatures of the oxides are lower than that of the corresponding metal. With respect to metals such as calcium, nickel and copper while they may be utilized in preparing single crystals in accordance with the present invention, the high melting points of such metals makes such preparation generally economically unfeasible.

The most common anode metal for which the present invention is particularly useful is zinc. The following description and examples therefore describe the formation and utilization of irregular shaped single crystal anode material thereof.

Zinc melts at a temperature of about 419° C. and zinc oxide has a melting point, far above such temperature, of 1975° C. Additionally, zinc oxide is easily formed into a continuous and very strong coating even when very thin such as of the order of about one micron. The zinc oxide is also easily solvated by materials such as acetic acid for facilitated removal thereof in accordance with normal accepted processes in which the zinc is cleaned prior to use thereof as an anode in an electrochemical cell.

In preparing the irregular shaped single crystal zinc particles, for use as an anode material, irregular shaped polycrystalline zinc particles with a particle size distribution of between −20 to 325 mesh with an average particle size of between −60 and 100 mesh are utilized. such polycrystalline particles are initially oxidized, preferably in air, at an elevated temperature but below the melting point of the zinc for a selected period of time and temperature whereby a continuous zinc oxide layer is formed on substantially each of the zinc particles. The zinc oxide layer formed should be of sufficient thickness for adequate mechanical strength to contain substantially melted and solidified metal particles therein. Generally, a layer of about one micron has been found to be sufficient for such purposes. For particles in the aforementioned preferred size range a quantitative determination of about 1.55 by weight of zinc oxide generally indicates the formation of an adequate oxide coating. To ensure that the particles are uniformally coated it is preferred that the particles be constantly agitated such as by rotation while being heated.

Once the particles have been substantially oxide coated they are then admixed with a combustible material and then subjected to a temperature above the melting point of the zinc. Such melting temperature should be sufficient to cause the combustible material to burn and consume all the free oxygen and to melt all of the zinc contained within each enclosed particle but preferably not excessively high whereby it becomes unnecessarily uneconomical. An oxidizing temperature range of between 370° C.–400° C. and a melting temperature of at least 470° C. have been found to be sufficient for effecting the oxidation and melting as required. With respect to the melting operation is is carried out in an enclosed container or in an inert atmosphere in order to prevent further oxidation of the zinc.

Although any commonly available combustible material capable of burning completely at temperatures of 200° C. to 500° C. may be employed, preferred materials are paraffin oil, alcohol, and mineral spirits.

The melted particles are then furnace cooled which provides a sufficiently slow period of time for the formation of more than about 90% single crystal particles. The single crystal zinc particles are then cleaned by solvation of the zinc oxide coating with acetic acid and then mercury amalgamater (preferably by wet amalgamation to ensure cleaning off of the oxide) for use as conventional anodes in alkaline electrolyte cells. Alternatively the particles may be first amalgamated and then surface cleaned in accordance with accepted zinc anode preparation methods. A 4% mercury amalgamation of the single crystal zinc particles when compared to the same size polycrystalline particles provides comparative gassing results at 90° C. as follows:

The following examples illustrate the efficacy of the present invention in providing a means whereby reduction of mercury can be effected without increase in cell gassing or significant decrease in cell performance. It is understood that the following examples are presented for illustrative purposes and that details contained therein are not to be construed as limitations on the present invention. Unless otherwise indicated all parts are parts by weight.

EXAMPLE 1

Irregular shaped zinc power with an average particle size of between −60 to 100 mesh US Standard was oxidized in a rotary calciner furnace (18" dia.×30') at 370° C. with a controlled amount (200 CFH) of air as an oxidant. The tube was rotated at 2.5 rpm with an oxidized zinc production rate of about 1000 lb./hr. The oxidized zinc contained about 1.5% ZnO as chemically determined. The oxidized zinc powder was then passed through a belt furnace at the rate of 4 inches (10.1 cm)/min in open trays of 125 pounds each with a furnace temperature of 470° C. The belt furnace was under a nitrogen blanket to avoid any further oxidation of the zinc powder. Before the zinc powder was added to the tray, 10 ml. of iso-propanol was sprayed onto the bottom of the tray as the combustible material. The zinc powder was then loaded onto the tray and immediately pushed into the belt furnace. The hot iso-propanol in the tray evaporated and burned in the belt furnace which was controlled at 470° C. to consume all remaining oxygen in the interstial spaces between zinc particles.

After the zinc metal within the oxide crucible was melted in the hot zone of the furnace (approximately 120 minutes), it was then allowed to slowly cool with nearly 1000 pounds per hour production of single crystal zinc particles of substantially the original irregular shapes.

EXAMPLE 2

Ten AA size cells were made with $MnO_2$ cathodes (9.0 gms), alkaline electrolytes of 40% KOH (3.036 gms) and anodes of the irregular shaped single crystal zinc particles of Example 1 with 1.03% starch graft copolymer gelling agent and 3% Hg amalgam (3.162 gms-anode weight). The cells were discharged under a 3.9 ohm load to various cut-off voltages with the discharge times given in Table II.

EXAMPLE 3

Ten cells were made as in Example 2 but with irregular shaped polycrystalline zinc with a 6.5% mercury amalgam. The cells were similarly discharged with the discharge to various cutoff voltages given in Table III.

TABLE III

| | DISCHARGE DATA (HOURS, 3.9 OHM LOAD) | | | |
|---|---|---|---|---|
| EXAMPLE NO. | 1.1 V | 1.0 V | 0.9 V | 0.8 V |
| 2 | 2.694 | 4.407 | 5.292 | 5.940 |
| | (.180) | (.114) | (.100) | (.108) |
| 3 | 2.674 | 4.366 | 5.121 | 5.865 |
| | (.056) | (.028) | (.050) | (.039) |

It may be noted from the above comparative table that the capacity of the cells having the single crystal zinc particles in the anodes thereof is not significantly different from those of the cells utilizing the polycrystalline zinc in the anodes.

EXAMPLE 4

Cells were made as in Examples 2 and 3 and were tested for gas evolution after periods of storage at 71° C. of 0, 1 week, 2 weeks and 4 weeks, after no discharge and 25% of discharge (25% of the time required for discharge to 0.8 volts) with the results given in Table IV.

TABLE IV

| Time at 71° C. | | Example 2 Cells No Discharge | 25% | Example 3 Cells No Discharge | 25% |
|---|---|---|---|---|---|
| 0 | Volume gas (mil) | 0.20 | 0.21 | 0.18 | 0.20 |
| | No. of cells | 5 | 5 | 5 | 5 |
| 1 Wk | Volume gas (mil) | 0.31 | 0.30 | 0.21 | 0.29 |
| | No. of cells | 5 | 5 | 5 | 5 |
| 2 Wks | Volume gas (mil) | 0.40 | 0.43 | 0.25 | 0.45 |
| | No. of cells | 5 | 5 | 5 | 5 |
| 3 Wks | Volume gas (mil) | 0.45 | 0.61 | 0.28 | 0.60 |
| | No. of cells | 5 | 5 | 5 | 5 |
| 4 Wks | Volume gas (mil) | 0.51 | 0.86 | 0.31 | 0.84 |
| | No. of cells | 5 | 5 | 5 | 5 |

It is evident from the above comparative tables that the utilization of the single crystal zinc particles of the present invention permits reduction of the amount mercury required for amalgamation from 7% to about 4% with nearly equivalent discharge and gassing characteristics. In fact, the direct comparisons between the cells having the single crystal zinc anodes and the polycrystalline anodes with the same 4% of mercury amalgamation clearly delineate the advantages of the present invention.

It is understood that the above examples are illustrative of the present invention and are not to be construed as being limitations of the present invention. Changes in the composition of the crystallized materials, the coatings, processes as well as the structure are components of the cells may be made without departing from the scope of the present invention as defined in the following claims.

What is claimed is:

1. In a method for making single crystal metal particles consisting of the steps of:
   (a) forming individual substantially continuous coatings on the external surfaces of each of the individual particles of a particulate metal material which is capable of being crystallized, said coatings being of a material having higher melting and decomposition temperatures than the melting and decomposition temperatures of said particulate metal material and wherein said coatings are each of a thickness and composition with sufficient mechanical strength to act as self supporting shape retaining crucibles for said metal particles when such metal particles are melted;
   (b) raising the temperature of said coated particulate metal material to above the melting point thereof but below the lower of the melting point or the decomposition temperature of said coating material whereby substantially all of the particulate metal material is melted within said coating; and
   (c) slowly cooling said particulate metal material whereby substantially all of said particles become individual single metal crystals;
   the improvement which comprises adding a combustible material to the container containing said coated particulate metal material prior to commencing step (b), said material being capable of totally combusting at the temperatures employed in step (b).

2. The method of claim 1 wherein said coatings are each removed without substantially disrupting said single crystals.

3. The method of claim 1 wherein said coatings are each about 1 micron thick.

4. The method of claim 1 where in single crystal particles are of an irregular shape.

5. The method of claim 1 wherein the particular metal material has a particle size between about 50 and 500 microns.

6. The method of claim 1 wherein said particulate metal material is melted in a non-reactive environment.

7. The method of claim 1 wherein said particulate metal material is comprised of particles of irregular shape and said single crystals are of substantially corresponding irregular shape.

8. The method of claim 1 wherein said coating material is an oxide of said metal material.

9. The method of claim 8 wherein said coating material is formed on said metal particles by heating said metal particles in the presence of an oxidant at an elevated temperature below the melting point of said metal.

10. The method of claim 9 wherein said metal is zinc and said elevated temperature is between 370° C. to 400° C.

11. The method of claim 8 wherein said metals are selected from the group consisting of aluminum, cadmium, lead, lithium, magnesium, potassium, rubidium, sodium, tin and zinc.

12. The method of claim 2 wherein the removal of said oxide coating is effected by solvation thereof.

* * * * *